(12) United States Patent
Fischer et al.

(10) Patent No.: US 10,167,402 B2
(45) Date of Patent: Jan. 1, 2019

(54) ELECTRO-OPTICAL SECURITY ELEMENT FOR SECURTIY AND/OR VALUABLE DOCUMENT

(71) Applicant: Bundesdruckerei GmbH, Berlin (DE)

(72) Inventors: Joerg Fischer, Berlin (DE); Manfred Paeschke, Wandlitz OT Basdorf (DE); Oliver Muth, Berlin (DE); Arthur Mathea, Berlin (DE)

(73) Assignee: BUNDESDRUCKEREI GMBH, Berlin (DE)

( * ) Notice: Subject to any disclaimer, the term of this patent is extended or adjusted under 35 U.S.C. 154(b) by 57 days.

(21) Appl. No.: 15/400,242

(22) Filed: Jan. 6, 2017

(65) Prior Publication Data

US 2017/0122873 A1 May 4, 2017

Related U.S. Application Data

(63) Continuation of application No. 14/362,257, filed as application No. PCT/DE2012/001196 on Nov. 30, 2012, now abandoned.

(30) Foreign Application Priority Data

Dec. 1, 2011 (DE) .................. 10 2011 119 821

(51) Int. Cl.
*G01N 21/64* (2006.01)
*B42D 25/29* (2014.01)
(Continued)

(52) U.S. Cl.
CPC .............. *C09D 11/50* (2013.01); *B42D 25/29* (2014.10); *B42D 25/36* (2014.10); *B42D 25/364* (2014.10);
(Continued)

(58) Field of Classification Search
CPC ............ G01N 21/6489; H01L 51/0035; H01L 51/5072; H01L 51/5056; H01L 51/5016;
(Continued)

(56) References Cited

U.S. PATENT DOCUMENTS 2,970,131 A 1/1961 Moyer
2,991,273 A 7/1961 Hechelhammer
(Continued)

FOREIGN PATENT DOCUMENTS

DE 1570703 10/1965
DE 2063050 7/1972
(Continued)

OTHER PUBLICATIONS

R. Fiesel et al., Angew. Chem. 108:2233 (1996).
(Continued)

*Primary Examiner* — Seung C Sohn
(74) *Attorney, Agent, or Firm* — Mayer & Williams, PC; Stuart Mayer

(57) ABSTRACT

A security element for a security and/or valuable document includes a matrix based on an organic polymeric material and at least one electrically conductive pigment dispersed in the matrix and at least one organic luminescent substance dispersed in the matrix. In the presence of the conductive pigment the luminescent substance is capable of non-contact excitation of light emission where the particle size is less than 200 nm. The luminescent substance is not encapsulated and is directly surrounded by the matrix and is embedded therein.

13 Claims, 2 Drawing Sheets

(51) Int. Cl.
| | |
|---|---|
| *C09D 11/50* | (2014.01) |
| *B42D 25/378* | (2014.01) |
| *B42D 25/373* | (2014.01) |
| *B42D 25/364* | (2014.01) |
| *C09D 11/52* | (2014.01) |
| *C09D 11/033* | (2014.01) |
| *C09D 11/037* | (2014.01) |
| *H01L 51/00* | (2006.01) |
| *C09K 11/06* | (2006.01) |
| *C09K 11/02* | (2006.01) |
| *C09D 11/10* | (2014.01) |
| *G07D 7/12* | (2016.01) |
| *B42D 25/36* | (2014.01) |

(52) U.S. Cl.
CPC ......... *B42D 25/373* (2014.10); *B42D 25/378* (2014.10); *C09D 11/033* (2013.01); *C09D 11/037* (2013.01); *C09D 11/10* (2013.01); *C09D 11/52* (2013.01); *C09K 11/02* (2013.01); *C09K 11/06* (2013.01); *G07D 7/12* (2013.01); *H01L 51/0085* (2013.01); *C09K 2211/1011* (2013.01); *C09K 2211/185* (2013.01); *H01L 51/007* (2013.01)

(58) Field of Classification Search
CPC ..... H01L 51/0085; C09D 11/50; C09K 11/02; C09K 11/06
USPC .................................................. 250/559.44
See application file for complete search history.

(56) References Cited

U.S. PATENT DOCUMENTS

| | | | |
|---|---|---|---|
| 2,999,846 | A | 9/1961 | Schnell |
| 3,028,365 | A | 4/1962 | Schnell |
| 3,062,781 | A | 11/1962 | Bottenbruch |
| 3,148,172 | A | 9/1964 | Fox |
| 3,271,367 | A | 9/1966 | Schnell |
| 3,275,601 | A | 9/1966 | Schnell |
| 6,221,144 | B1 | 4/2001 | Dietz |
| 7,524,567 | B2 | 4/2009 | Park et al. |
| 7,838,858 | B2* | 11/2010 | Okita ................... G03F 9/7003 250/221 |
| 8,998,265 | B2 | 4/2015 | Bleikolm |
| 9,754,341 | B2* | 9/2017 | Falkenstern .......... G06T 1/0021 |
| 2005/0103434 | A1 | 5/2005 | Nguyen et al. |
| 2006/0115110 | A1 | 6/2006 | Rodriguez |
| 2007/0199999 | A1* | 8/2007 | Bailleu ................... B42D 25/29 235/487 |
| 2010/0260985 | A1 | 10/2010 | Hagemann |
| 2011/0269065 | A1 | 11/2011 | Vanbesien et al. |

FOREIGN PATENT DOCUMENTS

| | | |
|---|---|---|
| DE | 2063052 | 7/1972 |
| DE | 2211956 | 10/1973 |
| DE | 10304805 | 8/2004 |
| DE | 102008034021 A1 | 1/2010 |
| EP | 0688839 | 12/1995 |
| EP | 2229942 | 8/2012 |
| FR | 1561518 | 3/1968 |
| GB | 1122003 | 7/1968 |
| GB | 1229482 | 4/1971 |
| GB | 1341318 | 12/1973 |
| GB | 1367788 | 9/1974 |
| GB | 1367790 | 9/1974 |
| WO | 2004070667 | 8/2004 |
| WO | 2005/115766 A1 | 12/2005 |
| WO | 2010/006583 A1 | 1/2010 |
| WO | 2010037638 A2 | 4/2010 |

OTHER PUBLICATIONS

Becker et al., Developments in Polymer Materials for Electroluminescence, Horst Vestweber Covion Organic Semiconductors GmbH, Organic Light-Emitting Materials and Devices V. Zakya H. Kafafi, Editor, Proceedings of SPIE vol. 4464 (2002), pp. 49-58.

Schnell, "Chemistry and Physics of Polycarbonates", Polymer Reviews, vol. IX, pp. 33-76, Interscience Publication 1964.

Qiu et al., "Preparation and Characterization of High Efficient Blue-Light Emitting Materials with a Secondary Ligand for Organic Electroluminescence", Jpn. J. Appl. Phys. vol. 39 (2000) pp. 1151-1153.

Kalinowski et al., "Magnetic field effects on emission and current in Alq3-based electroluminescent diodes", Chemical Physics Letters 380 (2003) 710-715.

Schrader, "Organic Light-emitting Diode Materials", Organic Photonic Materials and Devices V, Proceedings of SPIE vol. 4991 (2003) pp. 45-63.

Holmes, et al., "A New Family of Polyfluorene Copolymers for Light Emitting Devices", Organic Light-Emitting Materials and Devices V, Proceedings of SPIE vol. 4464 (2002), pp. 42-48.

\* cited by examiner

ELECTRO-OPTICAL SECURITY ELEMENT FOR SECURTIY AND/OR VALUABLE DOCUMENT

CROSS REFERENCE TO RELATED APPLICATIONS

This application is a continuation of U.S. application Ser. No. 14/362,257, filed Jun. 2, 2014, which is a 371 National Phase in the United States of PCT/DE2012/001196, filed Nov. 30, 2012, which claims priority to German Application No. 102011119821.4, filed Dec. 1, 2011. The contents of the applications indicated above are incorporated herein by reference.

FIELD OF THE INVENTION

The invention relates to a security element, particularly for a security and/or valuable document, comprising a matrix based on an organic polymeric material, at least one electrically conductive pigment dispersed in the matrix, and at least one luminescent substance dispersed in the matrix, which luminescent substance is capable, in the presence of the conductive pigment, of non-contact excitation of light emission, and a printable composition for the preparation of such a security element, a security and/or valuable document having such a security element, as well as methods for the preparation and verification of such a security and/or valuable document.

BACKGROUND OF THE INVENTION AND PRIOR ART

Safety and/or security documents, identity cards, passports, ID cards, access control cards, visas, control characters, tickets, driver's licenses, motor vehicle documents, bank notes, checks, postage stamps, credit cards, any smart cards and adhesive labels (e.g. for product protection) often comprise at least one substrate and a partially or completely transparent cover layer. Substrate and cover layer may in turn consist of a plurality of layers. To make forgery of such documents more difficult, they are equipped with security elements. For example, bank notes and postage stamps may consist of one substrate or substrate layer only, to which security elements can then be applied, for example in the form of a printing ink. Some security elements include substances being luminescent under certain physical conditions, and a verification can be carried out by visual inspection or automatic detection of the luminescence under these conditions.

Security elements of the type mentioned are known in the art, for example from the documents WO 2005/115766 A1 or WO 2010/006583. Particulate luminescent substances are used, which may be encapsulated, i.e. have a core/shell structure. These core/shell structures are embedded in a polymeric matrix. In general, the substances having the electroluminescent properties are always present in a particulate form, with particle sizes above 200 nm.

A disadvantage of the security elements known so far is the relatively low luminescence obtained under given excitation conditions and the high cost of production of core/shell structures.

From the document EP 0688839 A2, polycarbonates based on a geminally disubstituted dihydroxydiphenyl cycloalkane are per se known. In this prior art, such polycarbonates are used as binders for screen-printing inks. This document also describes methods for making such polycarbonates.

TECHNICAL OBJECT OF THE INVENTION

The invention is therefore based on the technical object of specifying a security element, which can be produced at relatively low cost and satisfies all requirements in view of the observable and/or measurable luminescence under excitation conditions and may also have other advantages, in particular have an increased diversity in the selection of radiation-emitting substances (UV, VIS, IR) and/or an increased security against counterfeiting.

PRINCIPLES OF THE INVENTION AND PREFERRED EMBODIMENTS

Figure 1:
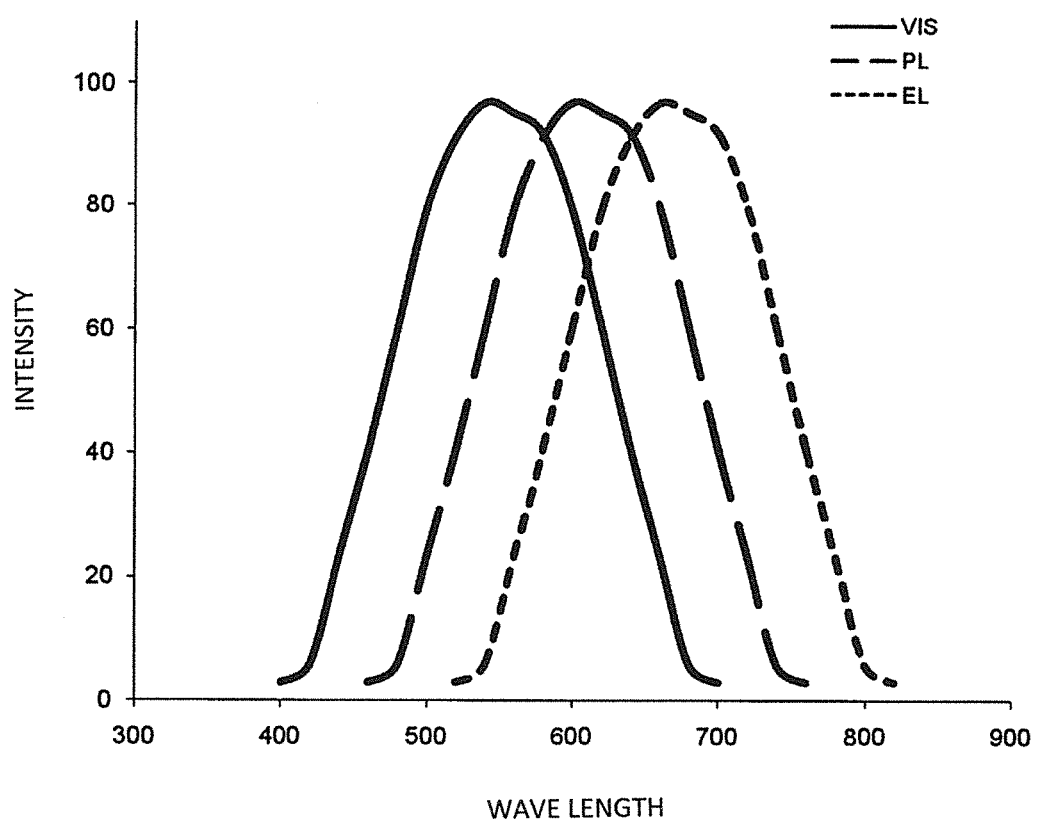
FIG. 1 shows an illustrative spectrum arising from one embodiment of the invention.
Figure 2:
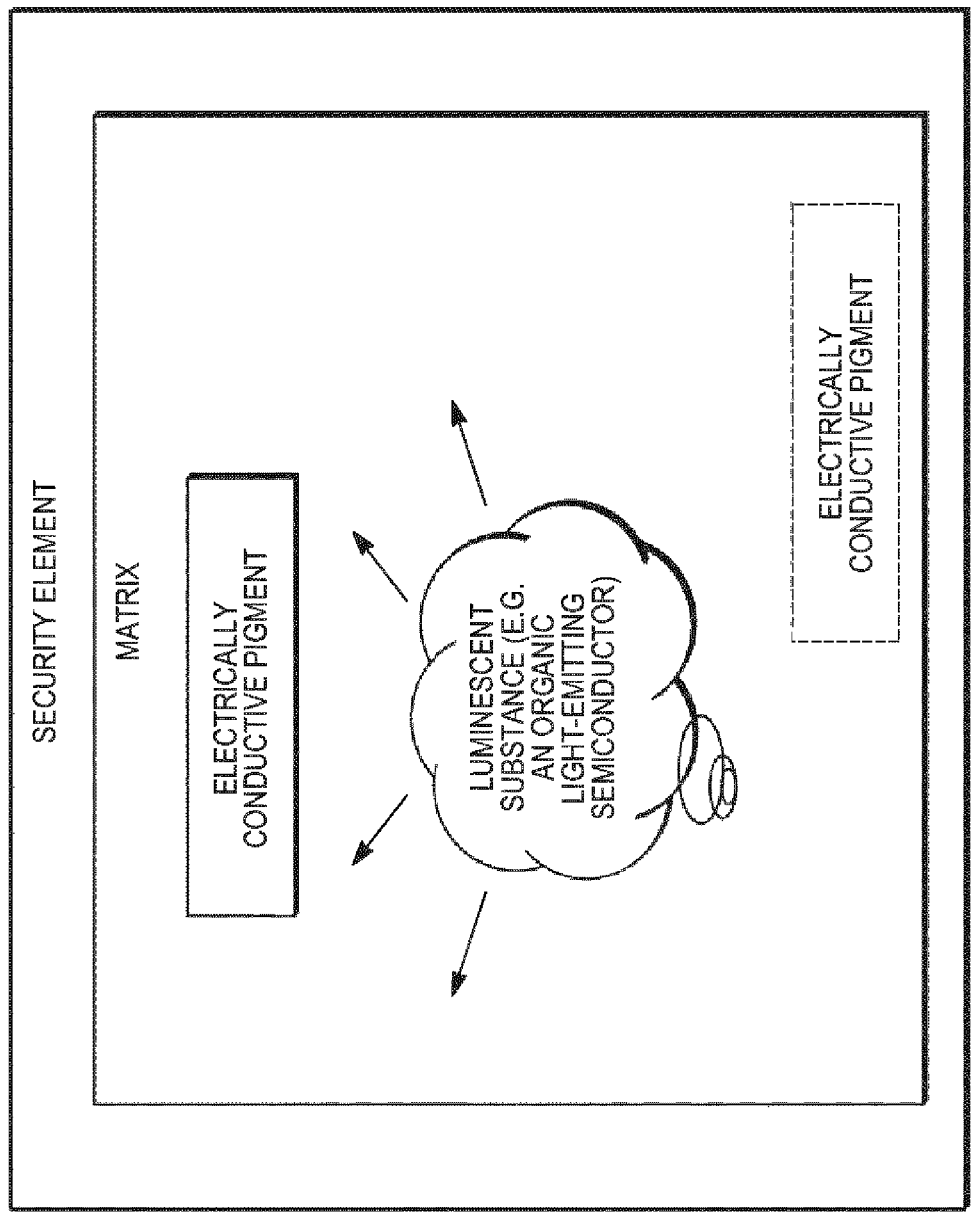
FIG. 2 shows an illustration of a security element with a matrix, at least one electrically conductive pigment and at least one luminescent substance dispersed in the matrix where the luminescent substance is capable of non-contact excitation of light emission.

To achieve this technical object, the invention teaches a preferably machine-readable or machine-detectable security element for a security and/or valuable document comprising a (non-conductive) matrix based on an organic polymeric material, at least one electrically conductive pigment dispersed in the matrix, and at least one luminescent substance dispersed in the matrix, which luminescent substance is capable, in the presence of the conductive pigment, of non-contact excitation of light emission, and wherein the luminescent substance is preferably not encapsulated and is directly surrounded by the matrix and is embedded therein.

The term "in the presence" means that the luminescent substance can in any case be stimulated for non-contact emission when the conductive pigment, in addition to the luminescent substance, is also present in a sufficient quantity in the matrix.

In principle, the organic polymeric material may be an arbitrary polymeric material used in the field of security and/or valuable documents. Examples are: transparent, opaque, or non-transparent polymeric materials, such as PC (polycarbonate, especially bisphenol A polycarbonate), PET (polyethylene glycol terephthalate), PMMA (polymethyl methacrylate), TPU (thermoplastic polyurethane elastomers), PE (polyethylene), PP (polypropylene), PI (polyimide, or poly-trans-isoprene), PVC (polyvinyl chloride), polystyrene, polyacrylates and methacrylates, vinyl esters, ABS and copolymers of such polymers. Preferred is a polycarbonate derivative, in particular based on bisphenol A, preferably based on a geminally disubstituted dihydroxy diphenyl cycloalkane.

It is preferred that the polymer, for example the polycarbonate derivative has an average molecular weight (weight average) of at least 10,000, preferably 20,000 to 300,000.

In detail, the polycarbonate derivative may contain functional carbonate structural units of formula (I),

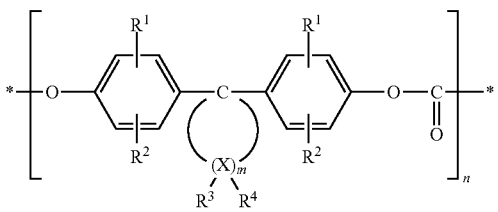

(I)

wherein $R^1$ and $R^2$ are independently from each other hydrogen, halogen, preferably chlorine or bromine, $C_1$-$C_8$ alkyl, $C_5$-$C_6$ cycloalkyl, $C_6$-$C_{10}$ aryl, preferably phenyl, and $C_7$-$C_{12}$ aralkyl, preferably phenyl-$C_1$-$C_4$ alkyl, in particular benzyl; m is an integer from 4 to 7, preferably 4 or 5; $R^3$ and $R^4$ can be individually selected for each X, and independently represent hydrogen or $C_1$-$C_6$ alkyl; X is carbon and n an integer greater than 20, with the proviso that at least at one atom X, $R^3$ and $R^4$ are both alkyl.

Further, it is preferred that at 1 to 2 atoms X, in particular at one atom X only, $R^3$ and $R^4$ both are alkyl. $R^3$ and $R^4$ may in particular be methyl. The X atoms in the alpha position to the diphenyl-substituted C atom (C1) cannot be dialkyl-substituted. The X atoms in the beta position to C1 can be disubstituted with alkyl. Preferably is m=4 or 5. The polycarbonate derivative may for instance be formed based on monomers, such as 4,4'-(3,3,5-trimethyl cyclohexane-1,1-diyl) diphenol, 4,4'-(3,3-dimethyl cyclohexane-1,1-diyl) diphenol, or 4,4'-(2,4,4-trimethyl cyclopentane-1,1-diyl) diphenol.

A polycarbonate derivative according to the invention may for instance be made from diphenols of formula (Ia) according to the document DE 38 32 396.6, the scope of disclosure of which with its complete contents is hereby included in the scope of disclosure of this description.

A diphenol of formula (Ia) under formation of homopolycarbonates as well as several diphenols of formula (Ia) under formation of copolycarbonates can be used (the meaning of radicals, groups and parameters same as in formula I).

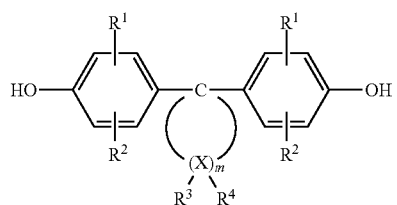

(Ia)

Furthermore, the diphenols of formula (Ia) can also be used in a mixture with other diphenols, for instance with those of formula (Ib)

for making high-molecular, thermoplastic, aromatic polycarbonate derivatives.

Suitable other diphenols of formula (Ib) are those, wherein Z is an aromatic radical with 6 to 30 C atoms, which may contain one or several aromatic nuclei, be substituted and contain aliphatic radicals or other cycloaliphatic radicals than those of formula (Ia) or heteroatoms as bridge members.

Examples for the diphenols of formula (Ib) are: hydroquinone, resorcin, dihydroxydiphenyls, bi-(hydroxyphenyl) alkanes, bis-(hydroxyphenyl) cycloalkanes, bis-(hydroxyphenyl) sulfides, bis-(hydroxyphenyl) ethers, bis-(hydroxyphenyl) ketones, bis-(hydroxyphenyl) sulfones, bis-(hydroxyphenyl) sulfoxides, alpha,alpha'-bis-(hy-droxyphenyl) diisopropylbenzenes and their nuclear-alkylated and nuclear-halogenated compounds.

These and other suitable diphenols are e.g. described in the documents U.S. Pat. Nos. 3,028,365, 2,999,835, 3,148,172, 3,275,601, 2,991,273, 3,271,367, 3,062,781, 2,970,131, and 2,999,846, in the documents DE-A 1 570 703, 2 063 050, 2 063 052, 2 211 956, the FR-A 1 561 518 and in the monograph "H. Schnell, Chemistry and Physics of Polycarbonates, Interscience Publishers, New York 1964", which with its complete contents is hereby included in the scope of disclosure of the present application.

Preferred other diphenols are for instance: 4,4'-dihydroxydiphenyl, 2,2-bis-(4-hydroxyphenyl) propane, 2,4-bis-(4-hydroxyphenyl) 2-methylbutane, 1,1-bis-(4-hydroxyphenyl) cyclohexane, alpha,alpha-bis-(4-hydroxyphenyl) p-diisopropylbenzene, 2,2-bis-(3-methyl-4-hydroxyphenyl) propane, 2,2-bis-(3-chloro-4-hydroxyphenyl) propane, bis-(3,5-dimethyl-4-hydroxyphenyl) methane, 2,2-bis-(3,5-dimethyl-4-hydroxyphenyl) propane, bis-(3,5-dimethyl-4-hydroxyphenyl) sulfone, 2,4-bis-(3,5-dimethyl-4-hydroxyphenyl) 2-methylbutane, 1,1-bis-(3,5-dimethyl-4-hydroxyphenyl) cyclohexane, alpha,alpha-bis-(3,5-dimethyl-4-hydroxyphenyl) p-diisopropylbenzene, 2,2-bis-(3,5-dichloro-4-hydroxyphenyl) propane, and 2,2-bis-(3,5-dibromo-4-hydroxyphenyl) propane.

Particularly preferred diphenols of formula (Ib) are for instance: 2,2-bis-(4-hydroxyphenyl) propane, 2,2-bis-(3,5-dimethyl-4-hydroxyphenyl) propane, 2,2-bis-(3,5-dichloro-4-hydroxyphenyl) propane, 2,2-bis-(3,5-dibromo-4-hydroxyphenyl) propane, and 1,1-bis-(4-hydroxyphenyl) cyclohexane. In particular, 2,2-bis-(4-hydroxyphenyl) propane is preferred. The other diphenols may be used individually as well as in a mixture.

The molar ratio of diphenols of formula (Ia) to, if applicable, the optionally also used other diphenols of formula (Ib) should be between 100 mol-% (Ia) to 0 mol-% (Ib) and 2 mol-% (Ia) to 98 mol-% (Ib), preferably between 100 mol-% (Ia) to 0 mol-% (Ib) and 10 mol-% (Ia) to 90 mol-% (Ib), and in particular between 100 mol-% (Ia) to 0 mol-% (Ib) and 30 mol-% (Ia) to 70 mol-% (Ib), especially between 100 mol-% (Ia) to 0 mol-% (Ib) and 50 mol-% (Ia) to 50 mol-% (Ib).

The high-molecular polycarbonates from the diphenols of formula (Ia), if applicable, in combination with other diphenols, may be made according to the known polycarbonate production methods. The different diphenols may be linked in a statistical manner as well as also block-wise.

The polycarbonate derivatives used according to the invention may be branched in a per se known manner. If branching is desired, this can be achieved in a per se known manner by condensation of small amounts, preferably amounts between 0.05 and 2.0 mol-% (referred to the used diphenols), of three or more than three-functional compounds, in particular such with three or more than three phenolic hydroxyl groups. Some branching agents with three or more than three phenolic hydroxyl groups are: phloroglucin, 4,6-dimethyl-2,4,6-tri-(4-hydroxyphenyl)-heptene-2, 4,6-dimethyl-2,4,6-tri-(4-hydroxy-phenyl)-heptane, 1,3,5-tri-(4-hydroxyphenyl)-benzene, 1,1,1-tri-(4-hydroxyphenyl)-ethane, tri-(4-hydroxyphenyl)-phenylmethane, 2,2-bis-[4,4-bis-(4-hydroxyphenyl)-cyclohexyl]-propane, 2,4-bis-(4-hydroxyphenyl-isopropyl)-phenol, 2,6-is-(2-hydroxy-5-methyl-benzyl)-4- methylphenol, 2-(4-hydroxyphenyl)-2-(2,4-dihydroxyphenyl)-propane, hexa-[4-(4-hydroxyphenyl-isopropyl)-phenyl]-orthoterephthalic acid ester, tetra-(4-hydroxyphenyl)-methane, tetra-[4-(4-hydroxyphenyl-isopropyl)phenoxy]-methane, and 1,4-bis-[4',4"-dihydroxytriphenyl)-methyl]-benzene. Some of the other three-functional compounds are 2,4-dihydroxy benzoic acid, trimesic acid, cyanuric chloride, and 3,3-bis-(3-methyl-4-hydroxyphenyl)-2-oxo-2,3-dihydroindol.

As chain stoppers for the per se known control of the molecular weight of the polycarbonate derivatives are used monofunctional compounds in usual concentrations. Suitable compounds are e.g. phenol, tert-butylphenols or other alkyl-substituted phenols. For controlling the molecular weight, in particular small amounts of phenols of formula (Ic) are suitable

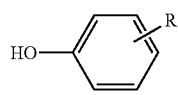

(Ic)

wherein R is a branched C8 and/or C9-alkyl radical.

Preferably the share of the CH$_3$ protons in the alkyl radical R is between 47 and 89% and the share of the CH and CH$_2$ protons is between 53 and 11%; also preferably R is in an o and/or p position to the OH group, and particularly preferably the upper limit of the ortho share is 20%. The chain stoppers are used in general in amounts from 0.5 to 10, preferably 1.5 to 8 mol-%, referred to the used diphenols.

The polycarbonate derivatives may preferably be made according to the phase boundary method (cf. H. Schnell, "Chemistry and Physics of Polycarbonates", Polymer Reviews, Vol. IX, page 33ff., Interscience Publ. 1964) in a per se known manner.

Herein, the diphenols of formula (Ia) are dissolved in an aqueous alkaline phase. For making copolycarbonates with other diphenols, mixtures of diphenols of formula (Ia) and the other diphenols, for instance those of formula (Ib), are used. For controlling the molecular weight, chain stoppers e.g. of formula (Ic) may be added. Then a reaction is performed in presence of an inert, preferably polycarbonate-dissolving, organic phase with phosgene according to the method of the phase boundary condensation. The reaction temperature is between 0° C. and 40° C.

The optionally also used branching agents (preferably 0.05 to 2.0 mol-%) may either be presented with the diphenols in the aqueous alkaline phase or may be added dissolved in the organic solvent before the phosgenation. Beside the diphenols of formula (Ia) and, if applicable, other diphenols (Ib), their mono and/or bis-chlorocarbonic acid esters can also be used, the latter being added dissolved in organic solvents. The amount of chain stoppers and of branching agents then depends on the molar amount of diphenolate radicals corresponding to formula (Ia) and, if applicable, formula (Ib); when chlorocarbonic acid esters are also used, the amount of phosgene can correspondingly be reduced in a known manner.

Suitable organic solvents for the chain stoppers and, if applicable, for the branching agents and the chlorocarbonic acid esters are for instance methylene chloride, chlorobenzene and in particular mixtures of methylene chloride and chlorobenzene. If applicable, the used chain stoppers and branching agents can be dissolved in the same solvent.

As an organic phase for the phase boundary polycondensation serves for instance methylene chloride, chlorobenzene and mixtures of methylene chloride and chlorobenzene.

As an aqueous alkaline phase serves for instance a NaOH solution. Making the polycarbonate derivatives according to the phase boundary method can by catalyzed in a usual manner by catalysts such as tertiary amines, in particular tertiary aliphatic amines such as tributylamine or triethylamine; the catalysts can be used in amounts from 0.05 to 10 mol-%, referred to the moles of used diphenols. The catalysts can be added before the phosgenation or during or also after the phosgenation.

The polycarbonate derivatives can be made according to the prior art method in a homogeneous phase, the so-called "pyridine method" and according to the prior art method for the melt transesterification by using for instance diphenyl carbonate instead of phosgene.

The polycarbonate derivatives may be linear or branched, they are homopolycarbonates or copolycarbonates based on the diphenols of formula (Ia).

By the arbitrary composition with other diphenols, in particular with those of formula (Ib), the polycarbonate properties can be varied in a favorable manner. In such copolycarbonates, the diphenols of formula (Ia) are contained in polycarbonate derivatives in amounts from 100 mol-% to 2 mol-%, preferably in amounts from 100 mol-% to 10 mol-% and in particular in amounts from 100 mol-% to 30 mol-%, especially in amounts from 100 mol-% to 50 mol-% referred to the total amount of 100 mol-% of diphenol units.

A particularly advantageous embodiment of the invention is characterized by that the polycarbonate derivative comprises a copolymer in particular consisting of monomer units M1 based on bisphenol A, and monomer units M2 based on the geminally disubstituted dihydroxydiphenyl cycloalkane, preferably of the 4,4'-(3,3,5-trimethyl cyclohexane-1,1-diyl) diphenol, wherein the molar ratio M2/M1 is preferably greater than 0.5, in particular greater than 0.8, for instance greater than 1.0. For such copolymers it has namely been found that surprisingly the glass temperature Tg is below 150° C. after a first heating cycle and may be increased in a second heating cycle, which substantially improves the stability of the obtained structure.

Very particularly preferred is a liquid preparation comprising: A) 1 to 30 wt-% of a polycarbonate derivative used according to the invention, and B) 70 to 99 wt-% of an organic solvent or of a mixture of organic solvents.

The used organic solvents are preferably halogen-free solvents. These may in particular be aliphatic, cycloaliphatic, aromatic hydrocarbons, such as mesitylene, 1,2,4-trimethylbenzene, cumene and solvent naphtha, toluene, xylene; esters, such as methylacetate, ethylacetate, butylacetate, methoxypropylacetate, ethyl-3-ethoxypropionate. Preferred are mesitylene, 1,2,4-trimethylbenzene, cumene and solvent naphtha, toluene, xylene, acetic acid methyl ester, acetic acid ethyl ester, methoxypropylacetate, ethyl-3-ethoxypropionate. Particularly preferred are: mesitylene (1,3,5-trimethylbenzene), 1,2,4-trimethylbenzene, cumene (2-phenylpropane), solvent naphtha and ethyl-3-ethoxypropionate.

A suitable mixture of solvents comprises for instance, L1) 0 to 10 wt-%, preferably 1 to 5 wt-%, in particular 2 to 3 wt-% mesitylene, L2) 10 to 50 wt-%, preferably 25 to 50 wt-%, in particular 30 to 40 wt-% 1-methoxy-2-propanolacetate, L3) 0 to 20 wt-%, preferably 1 to 20 wt-%, in particular 7 to 15 wt-% 1,2,4-trimethylbenzene, L4) 10 to 50 wt-%, preferably 25 to 50 wt-%, in particular 30 to 40 wt-% ethyl-3-ethoxypropionate, L5) 0 to 10 wt-%, preferably 0.01 to 2 wt-%, in particular 0.05 to 0.5 wt-% cumene, and L6) 0 to 80 wt-%, preferably 1 to 40 wt-%, in particular 15 to 25 wt-% solvent naphtha, the relative amounts of the components L1) to L6) always totaling 100 wt-%. Instead of L2 and/or L4, or in addition thereto, the solvent mixture may also contain L7) with 10 to 50 wt-%, preferably 25 to 50 wt-%, in particular 30 to 60 wt-% butyl glycol acetate, the relative amounts of the components L1) to L7) always totaling 100 wt-%.

The term matrix means, for the purpose of the invention, that the polymeric material forming the matrix forms the main structural component, in which the other components are embedded and dispersed, preferably homogeneously dispersed. A homogeneous distribution is defined by that the amounts of the other components, be it on a molecular basis or as particles, are equal in each volume element, at least, referred to volume elements of the matrix of 1000 µm$^3$, differ from each other by less than 10%.

The luminescent substance may preferably be an organic substance, in particular an organic light-emitting semiconductor, for example an OLED material. This organic substance is non-particulate, and preferably is homogeneously dispersed in the matrix, in particular dissolved. Thereto belong so-called small molecules (typically <3000 da), including triplet emitters, and luminescent polymers, for example having a HOMO-LUMO gap in the range from 1.5 to 3.5 eV.

Examples of small molecules include N,N-diphenylaniline and derivatives thereof, 9H-fluorenes and derivatives thereof, anthracene and derivatives thereof, 4,4'-bis[(9-ethyl-3-carbazoyl) vinylenyl)] anthracene, 9,10-bis(9-ethyl-3-carbazovinylene)-1,1'-biphenyl, 4,4'-bis-(diphenylvinylenyl) biphenyl, 1,4-bis(9-ethyl-3-carbazovinylene)-2-methoxy-5-(2-thylhexyloxy) benzene, 4,4'-bis (diphenylvinylenyl) anthracene, 1,4-bis(9-ethyl-3-carbazovinylene)-9,9-dihexyl fluorene, 9,9,9',9', 9'',9''-hexakis(hexyl)-2,7',2',7''-trifluorene, analogous penta- and heptafluorenes, 9,9,9',9', 9'',9''-hexakis(octyl)-2,7',2',7''-trifluorene, analogous penta- and heptafluorenes, 3,7-bis-(9,9-di-n-hexylfluorene-2-yl)-dibenzothiophene-SS-dioxide, 2,7-bis-[(7-(9,9-di-n-hexylfluorene-2-yl)-dibenzothiophene-SS-dioxide-3-yl]-9,9-di-n-hexylfluorene, tetra-(2-methyl-8-hydroxyquinolinato) boronic, tetra-(8-hydroxyquinolinato) boronic, bis-(8-hydroxyquinolinato) zinc, bis-(2-methyl-8-hydroxyquinolinato) zinc, tris-(benzoylacetonato) mono (phenanathroline) europium (III), tris-(benzoylmethane) mono (phenanathroline) europium (III), tris-(benzoylmethane) mono (5-aminophenanathroline) europium (III), tris-(dinaphtoylmethane) mono (phenanathroline) europium (III) tris-(dibiphenoylmethane) mono (phenanathroline) europium (III), tris-[di(4-(2-(2-ethoxyethoxy) ethoxy) benzoylmethane)] mono (phenanathroline) europium (III), tris-(diben-zoylmethane) mono (4,7-diphenylphenanathroline) europium (III), bis-(2-methyl-quinolinolato) (phenolato) aluminum (III) (Y. QIU et al., Jpn. J. Appl. Phys. 39:1151-1153 (2000)), tris-(8-hydroxyquinolinato) aluminum (III) (J. Kalinowski et al., Chemical Physics Letters 380 (5-6): 710-715 (2003)), tris-(8-hydroxyquinolinato) gallium (III), platinum (III) [2-(4,6-difluorophenyl) pyridinato-N,C2) (acetyl-acetonate), iridium (III) bis-(2-(4,6-difluorophenyl) pyridinato-N,C2), iridium (III) bis-(2-(2'-ben-zothienyl) pyridinato-NC3') (acetyl-acetonate), tris-(1-phenylisoquinoline) iridium (III), bis-(1-phenylisoquiniloline) (acetylacetonate (iridium (III), iridium (III) bis-(dibenzo[f,h] quinoxaline) (acetylacetone), iridium (III) bis-(2-methyldibenzo[f,h] quinoxaline) (acetylacetonate), bis-(2-(9,9-dibu-tylfluore-nyl)-1-isoquinoline (acetylacetonate) iridium (III), bis-(2-(9, 9-dihexylfluorenyl)-1-pyridine (acetylacetonate) iridium (III), tris-(3-methyl-1-phenyl-4-trimethyl-acetyl-5-pyrazolines) terbium (III), tetraphenyl porphyrin, tetraphenyl butadiene, tris-(2-phenylpyridine) iridium (III), derivatives of tris-(2-phenylpyridine) iridium (III) which are methylated or halogenated, in particular fluorinated one or two times on the phenyl ring at an arbitrary position, bis-(2-phenylpyridine) (iridium-platinum octaethylporphyrin, europium-(dibenzoylmethanido)$_3$-based molecules (Eu(DBM)$_3$)X), such as Eu(DBM)$_3$-(dipyrido (3,2a-2',3'-c) phenazine), Eu(DBM)$_3$-(1,10-phenanthroline), Eu(DBM)$_3$-(2-(2-pyridyl) benzoxazole), Eu(DBM)$_3$-(2-(2-pyridyl) benzothiazole), terbium-(acetylacetone)$_3$-(1,10-phenanthroline), substances according to the document P. Schrade, Proc. SPIE, Photonic Mater. And Devices, V 2003, 4991, 45 (the disclosure of which is incorporated herein to its full extent). Small molecules may also be derivatized with functional groups, which improve the solubility in organic solvents, such as toluene, or in the solvents mentioned in context with the matrix.

Examples of polymers being capable of luminescing include poly(p-phenylene vinylene), alkyl-substituted, particularly dialkyl-, for example dimethyl-, diethyl- or dibutyl-substituted poly(p-phenylene vinylene) derivatives (substituents in para to each other), poly[2-methoxy-5-(3,7-dimethyloctyloxy)-p-phenylene vinylene), poly[2-methoxy-5-(3,7-dimethyloctyloxy)-p-phenylene vinylene) with POSS (polyoctahedral oligomeric silsesquioxane), DMP (dimethyl phenyl), N,N-bis-(4-methyl-phenyl)-4-aniline or 2,5-diphenyl-1,2,4-oxadiazole end caps, poly[2-methoxy-5-(2'-ethylhexyloxy)-p-phenylene vinylene), poly[2-methoxy-5-(2'-ethylhexyloxy)-p-phenylene vinylene) with POSS or DMP end caps, poly[2,5-bis-(3,7-dimethyloctyloxy)-1,4-phenylene vinylene], poly[2,5-bis-(3,7-dimethyloctyloxy)-1,4-phenylene vinylene], all optionally with POSS, DMP, N,N-bis-(4-methyl-phenyl)-4-aniline or 2,5-diphenyl-1,2,4-oxadiazole end caps, polyfluorene, poly(9,9-dialkylfluoreneyl-2,7-diyl), in particular poly(9,9-dioctylfluoreneyl-2,7-diyl) or poly[9,9-di(2-ethylhexyl)-fluorene-2,7-diyl] or poly(9,9-di{2-[2-(2-methoxy-ethoxy)-ethoxy]ethyl}-fluoreneyl-2,7-diyl), all optionally with POSS, DMP, N,N-bis-(4-methyl-phenyl)-4-aniline or 2,5-diphenyl-1,2,4-oxadiazole end caps, poly-N-vinylcarbazole, poly(p-phenylene), alkyl-substituted, in particular 2,5-dialkyl-, for example dimethyl-, diethyl- or dibutyl-substituted poly(p-phenylene) derivatives, poly[2-(6-cyano-6-methylheptyloxy)-1,4-phenylene], poly(2,5-dioctyl-1,4-phenylene), all optionally with POSS, DMP, N,N-bis-(4-methyl-phenyl)-4-aniline or 2,5-diphenyl-1,2,4-oxadiazole end caps, poly(spirofluorene), spiro(fluorene-benzofluorene), spirofluorene-based polymers according to U.S. Pat. No. 7,524,567 B2 or H. Becker et al., Proc. SPIE 4464:49-58 (2002) (the disclosure of which is hereby incorporated to its full extent), ladder-poly(p-phenylene) or ladder-poly(fluorene) according to R. Fiesel et al., Angew. Chem. 108:2233 (1996) (the disclosure of which is hereby incorporated to its full extent), polythiophenes, polythiophene derivatives, mono- or di-substituted PFO-OPV copolymers according to A. Holmes et al., Proc. SPIE 4464:42-48 (2002).

Suitable copolymers are, for example, poly [9,9-dioctyl-2,7-divinylene fluoreneylene)-alt-co (9,10-anthracene)], poly[9,9-dioctyl-2,7-divinylene fluoreneylene)-alt-co-{2-methoxy-5-(2-ethylhexyloxy)-1,4-phenylene}], poly[(9,9-dioctylfluoreneyl-2,7-diyl)-co-(1,4-vinylene phenylene)], poly [(9,9-dioctylfluoreneyl-2,7-diyl)-co-1,4-benzo{2,1'-3}-thiadiazole)], poly[(9,9-2-dihexylfluoreneyl,7-diyl)-co- (2-methoxy-5-{2-ethylhexyloxy}-1,4-phenylene)], poly[(9,9-dihexylfluoreneyl-2,7-diyl)-co-(2,5-9-xylene)], poly[(9,9-di(3,3'-N,N'-trimethylammonium)propylfluoreneyl-2,7-diyl)-alt-(9,9-dioctylfluoreneyl-2,7-diyl)], poly[(9,9-dioctylfluoreneyl-2,7-diyl)-co-(N,N'-diphenyl-N,N'-di(p-butyl-oxyphenyl)-1,4-diaminobenzene, poly [(9,9-dioctylfluoreneyl-2,7-diyl)-co-(1,4-benzo{2,1',3}-thiadiazole)] (9:1), all optionally with POSS, DMP N,N-bis-(4-methyl-phenyl)-4-aniline or 2,5-diphenyl-1,2,4-oxadiazole end caps.

Of an independent importance in the context of the invention is an embodiment wherein the luminescent substance is a particulate quantum dot material, and wherein the quantum dot material is preferably homogeneously dispersed in the matrix.

Quantum dots are small (crystalline) particles the exciton propagation of which is limited in all three spatial directions to values in the order of or less than the exciton Bohr radius. This ultimately leads to a width of the band gap between the valence band and the conduction band, which is variable depending on the geometric size of the particle. The smaller the particle, the greater the band gap, and the correspondingly higher the energy emitted after excitation, for example color. By reduction, for example, the color can be shifted from the long-wavelength range to ranges of shorter wavelengths. The size of the quantum dots is typically in the range from 1 to 20 nm, in particular 2 to 10 nm, and then the number of atoms of a particle is between 20 and 500,000, or between 100 and 100,000.

Quantum dots can uniformly consist of one material, but core/shell structures may also be formed, wherein core and shell are made of different materials, typically semiconductor materials having different band-gap widths, the material having a higher band gap generally forming the shell.

In the context of the invention, all materials may be used for quantum dots that have band gaps or exciton energies in the range from 1.5 to 3.5 eV for the above-mentioned particle sizes. Typical materials include CdSe, ZnS, ZnSe, CdZnSe, CdS, InAr, InP, CdSeS, generally all the semiconductor materials, which are found in the field of luminescent diodes, particularly group III/V semiconductors with the group III elements Al, Ga and In, and the group V elements N, P, As and Sb. From the mentioned elements can be formed binary, ternary and quaternary (and higher complexity) compounds in any combination, and the molar ratio of the group III elements to the group V elements is 1:1. For all mentioned materials, dopings are possible, if applicable, with atoms, which belong to none of the mentioned groups of elements. Other materials include phosphorus nanoparticles, which are doped with a rare earth element. Various Cd-free quantum dots are for example available from the company Nanoco Technologies Ltd., Manchester, UK, or from Aldrich Materials Science.

For the purpose of the present invention, mixtures of at least two, but also three, four or more substances being capable of light emission can be used, especially substances emitting with different colors, then mixed colors being formed, which makes the analysis and consequently counterfeiting even more difficult. If, for example, blue, green, and red luminescent materials are used, practically every color of the spectrum can be obtained by varying the proportions of the different substances.

For the purpose of the invention, a pigment containing an electrically conductive material or a mixture of such pigments is provided in the matrix. Electrically conductive pigments comprise at least one electrically conductive layer or electrically conductive particles, or consist thereof. It is not necessary, though preferable, that the pigment is homogeneously dispersed in the matrix. These pigments may be both so-called leafing pigments (when curing the matrix, they will be oriented toward the surface) and non-leafing pigments. In principle, the pigment may be transparent or non-transparent.

The addition of electrically conductive pigments is particularly advantageous when using electroluminophores as a luminescent substance, as therewith a reliable and non-contact excitation of the luminescence with electric fields can be secured. In addition, platelet-shaped conductive pigments act as field amplifiers due to the sharp edges or points present in this pigment form.

The electrically conductive layer and an electrically conductive particle may, for example, comprise or consist of one or a plurality of metal oxides made conductive by doping, for example, tin oxide, zinc oxide, indium oxide, and/or titanium oxide. For doping, Ga, Al, In, Th, Ge, Sn, P, Ar, Sb, Se, Te, W, and/or F can be used. Further, materials can be used, which are based on a carrier layer, for example based on titanium dioxide, synthetic or natural mica, other phyllosilicates, glass, silicon dioxide, and/or $Al_2O_3$, and carry thereon the electrically conductive layer, preferably are enwrapped by this layer. In addition to the carrier layer and the electrically conductive layer, other layers may be present, for example containing metal oxides, metal oxide hydrates, metal suboxides, metal fluorides, metal nitrides, metal oxynitrides, or mixtures of such substances. Preferably, the carrier layer and/or the other layers, if provided, and/or the electrically conductive layer are optically transparent or substantially transparent, i.e., they transmit at least 10%, preferably at least 70% of the incident light. The transparent or semi-transparent layers may be colorless or colored. The color properties of the electrically conductive pigments can also be modified by the additional layers, particularly if they are located below the conductive layer or between the carrier layer and the conductive layer. By application of other layers on the electrically conductive layer, the conductivity of the electrically conductive layer can be adjusted in accordance with given specifications.

The electrically conductive pigment is preferably mica coated with at least one electrically conductive metal oxide layer, especially mica coated with antimony-doped tin oxide. In addition, upon or below the electrically conductive layer, one or a plurality of metal oxide layers may be provided, such as a titanium oxide layer.

The diameter of an electrically conductive pigment is preferably in the range from 0.1 μm to 500 μm, preferably from 2 μm to 100 μm, more preferably from 5 μm to 70 μm. A narrow particle size distribution is preferred. Preferably, platelet-shaped electrically conductive pigments are used. The aspect ratio (diameter/thickness) for platelet-shaped conductive pigments is typically at least 2:1, in particular at least 10:1, better at least 100:1.

Particularly transparent with high conductivity are electrically conductive platelet-shaped pigments, the number-weighted mean grain area F50 (grain area: size of a main surface) of which is at least 150 $\mu m^2$, in particular at least 200 $\mu m^2$. It is advantageous, if the number-weighted rate of pigments having a particle size preferably less than 80 $\mu m^2$ is not more than 33%, in particular less than 25%, based on the total amount of electrically conductive pigment. Even better is a rate with a grain area less than 40 $\mu m^2$ of not more than 15%, particularly not more than 10%. This reduction of fine portions reduces light scattering and thus an opacity of the marking layer. The average grain area, based on the transparency, ideally is 1,000 µm², and may be up to 4,000 µm² or even more.

Suitable electrically conductive pigments are commercially available for example from Germany's leading providers of specialized pigments.

Also suitable are metallic effect pigments being established for the technology of coating agents, for example, Al-based, such as Al—MgF. Other base metals include copper, bronze, gold, silver, lead, zinc, and tin. Further can be used platelets of carbon, as they are available, for example, from pseudo-single crystals of carbon. For the particle dimensions, the statements made above apply in an analogous manner.

Instead of platelet-shaped conductive pigments, so-called nanorods can also be used. As already discussed above, as materials, in particular metals (in particular silver-colored), alloys and semiconductors can be used, but also carbon. The lengths are typically in the range from 1 to 200 nm, the aspect ratio (length to diameter) being in the range from 3 to 100, usually from 3 to 20. Likewise, nanotubes can be used, the diameter of which is typically less than 100 nm, in most cases less than 10 nm. In particular, nanotubes with a carbon structure are suitable. However, boron nitride, molybdenum, tungsten, or copper sulfide, nickel or cadmium chloride, cadmium iodide, or other sulfides or halides are also suitable. Nanotubes may have one or a plurality of walls. The ends may be open or closed. The interior may be empty, but also filled. The latter is recommended for tubular structures, which themselves are not conductive or semi-conductive. Filling will then include a conductive species, in particular metal, such as lead.

It is further possible to use mixtures of the above mentioned pigments, which, by the different work functions of the various pigment types, can result in local diode structures, when the appropriate HOMO/LUMO levels of the substance or particles capable of emitting light are achieved.

The electrically conductive pigments are arranged in the matrix preferably substantially in parallel to a main surface or a surface of the (cured) matrix, respectively. As a part of the security element, the matrix itself is typically formed as a film, coating agent layer, printing layer, or foil. The layer thickness is usually in the range from 5 µm to 500 µm, in particular from 20 µm to 500 µm.

For improving the electroluminescence, a charge carrier transport material may also be provided in the matrix. This is particularly advisable, for example, for triplet emitters, which will then reduce the required amount of triplet emitter substance for a given luminescence intensity. That is typically a hole transport material and an electron transport material. Examples of hole transport materials include arylamines, isoindoles, N,N'-bis-(3-methylphenyl)-N,N'-bis-(phenyl) benzidine, N,N'-bis-(4-methylphenyl)-N,N'-bis-(phenyl) benzidine, N,N'-bis-(2-naphtalenyl)-N,N'-bis-(phenyl) benzidine, 1,3,5-tris-(3-methyldiphenylamino) benzene, N,N'-bis-(1-naphtalenyl)-N,N'-bis-(phenyl) benzidine, N,N'-bis-(2-naphtalenyl)-N,N'-bis-(phenyl) benzidine, 4,4',4"-tris-(N,N-phenyl-3-methylphenylamino) triphenylamines, 4,4', N,N'-diphenylcarbazole, poly[9,9-dihexyl-fluorenyl-2,7-diyl)-co-(N,N-bis-{p-butylphenyl}-1,4-di-aminophenylene)], poly[(9,9-dioctylfluorenyl-2,7-diyl)-co-(N,N-bis-(4-butylphenyl-1,1'-biphenylene-4,4-diamine)], poly(N,N'-bis-(4-butylphenyl)-N,N'-bis-(phenyl) benzidine, N,N'-bis-(1-naphtalenyl)-N,N'-bis-(phenyl)-9,9-spirobifluorene, N,N'-bis-(3-methylphenyl)-N,N'-bis-(phenyl)-9,9-spirobifluorene, N,N-bis-(3-methylphenyl)-N,N'-bis-(phenyl)-9,9-dimethylfluorene. As a hole transport material, in particular, N,N,N',N'-tetrakis (4-methylphenyl) benzidine is suitable. If triplet emitters are used, besides electroluminescent materials and hole transport materials, an additional matrix polymer is preferably also employed, such as poly-vinylcarbazole (PVK) or polystyrene (PS).

Examples of electron transporting materials include oxadiazole, imidazole, 8-hydroxyquinolinolato-lithium, 2-(4-biphenyl)-5-(4-tert.-butylphenyl)-1,3,4-oxadiazole, 4,7-diphenyl-1,10-phenanthroline, 2,2',2"-(1,3,5-benzen-etriyl) tris-(1-phenyl-1-H-benzimidazole), 2,9-dimethyl-4,7-di-phenyl-a, 10-phenanthroline, bis-(2-methyl-8-quino-linolate)-4-(phenylphenolato) aluminum. An exemplary combination is tris-(2-(4-tolyl) pyridinato-N,C2) iridium (III) as an electroluminescent material, N,N'-bis-(4-methyl-phenyl)-N,N'-bis-(phenyl) benzidine as a hole transport material, and 2,2',2"-(1,3,5-benzinetriyl)-tris-(1-phenyl-1-H-benzimidazole) as an electron transport material.

The matrix may additionally comprise converting phosphors. For this purpose, by way of example, reference is made to the document EP 22299424 with respect to appropriate conversion phosphors. Conversion phosphors convert at least a portion of the primary radiation into a secondary radiation having a different wavelength. Thereby, a displacement of the emission spectrum is obtained. Thus, at a predetermined emission wavelength of the primary radiator, conversion phosphors still enable a variation of the emission wavelength, i.e., a defined predetermined modification thereof, whereby a greater variability with regard to the observable color or emission wavelength is achieved.

Apart from that, the matrix may additionally contain one or a plurality of substances or materials selected from the group consisting of color pigments, effect pigments, optically variable pigments, UV blockers, preservatives, and stabilizers. The pigments are in particular laser-sensitive pigments, such as, for example, described in the document WO 2010/006583 A, which also allows a modulation of the luminescence in the manner described therein.

With respect to additional pigments (different from the electrically conductive pigment used), it is possible that the matrix additionally comprises an organic or inorganic (absorbing) color pigment and/or effect pigment, or a mixture of such pigments. These may be, for example, at least one platelet-shaped effect pigment and/or an organic or inorganic color pigment.

Platelet-shaped effect pigments are designated platelet-shaped pearlescent pigments, predominantly transparent or semi-transparent interference pigments, and metallic effect pigments. Liquid crystal pigments, so-called LCPs, or structured polymeric platelets, so-called holographic pigments, are also included here. These platelet-shaped pigments are composed of one or a plurality of layers of different materials, if appropriate.

Pearlescent pigments consist of transparent platelets of a high refractive index and show, in a parallel orientation, a characteristic pearly luster by multiple reflection. Those pearlescent pigments, which in addition also show interference colors, are referred to as interference pigments.

Although, of course, conventional pearlescent pigments such as $TiO_2$ platelets, basic lead carbonate, BiOCl pigments or fish silver pigments, are in principle suitable, preferably interference pigments or metallic effect pigments are used as platelet-shaped effect pigments, which have on an inorganic platelet-shaped carrier at least one coating of a metal, metal oxide, metal oxide hydrate or mixtures thereof, a mixed metal oxide, metal suboxide, metal oxynitride, metal fluoride, BiOCl, or a polymer. The metallic effect pigments preferably comprise at least one metal layer.

The inorganic platelet-shaped carrier is preferably made of natural or synthetic mica, kaolin or other phyllosilicates, of glass, $SiO_2$, $TiO_2$, $Al_2O_3$, $Fe_2O_3$, polymeric platelets, graphite platelets, or metal platelets, such as aluminum, titanium, bronze, silver, copper, gold, steel, or various metal alloys. Carriers made of mica, glass, graphite, $SiO_2$, $TiO_2$, and $Al_2O_3$, or mixtures thereof are preferred.

The size of these carriers is not critical. They generally have a thickness between 0.01 and 5 µm, in particular between 0.05 and 4.5 µm. The extension in length or width is typically between 1 and 250 µm, preferably between 2 and 200 µm and in particular between 2 and 100 µm. They generally have an aspect ratio (ratio of the average diameter to the average particle thickness) from 2:1 to 25,000:1, in particular from 3:1 to 2,000:1.

Preferably, a coating applied to the carrier consists of metals, metal oxides, mixed metal oxides, metal suboxides, and metal fluorides, and in particular of a colorless or colored metal oxide selected from $TiO_2$, titanium suboxides, titanium oxynitrides, $Fe_2O_3$, $Fe_3O_4$, $SnO_2$, $Sb_2O_3$, $SiO_2$, $Al_2O_3$, $ZrO_2$, $B_2O_3$, $Cr_2O_3$, ZnO, CuO, NiO, or mixtures thereof. Coatings of metals are preferably made of aluminum, titanium, chromium, nickel, silver, zinc, molybdenum, tantalum, tungsten, palladium, copper, gold, platinum, or alloys comprising these. The preferred metal fluoride is $MgF_2$.

As platelet-shaped effect pigments are preferably used multi-layer effect pigments. These have multiple layers on a platelet-shaped, preferably non-metallic carrier, said layers preferably consisting of the materials mentioned above and having different refractive indexes in such a way that there are at least two layers each having a different refractive index alternately on the carrier, the refractive indices in the individual layers differing by at least 0.1 and preferably by at least 0.3. The layers on the carrier may be nearly transparent and colorless as well as transparent and colored or semi-transparent.

Further, the so-called LCPs consisting of crosslinked, aligned cholesteric liquid crystals, or also structured polymeric platelets designated holographic pigments may be used as platelet-shaped effect pigments.

The platelet-shaped effect pigments used are (same as the electrically conductive pigments) preferably transparent or semi-transparent. Semi-transparent pigments transmit at least 10%, transparent pigments, however, at least 70% of the incident visible light. Such platelet-shaped effect pigments are preferably used, since in a security and/or valuable product, their transparency contributes to a wide variety of possible background or subsurface colors and at the same time does not affect the intensity of the light emission generated by electroluminescence.

In certain embodiments of the present invention, it is however also possible that a platelet-shaped effect pigment is used, which has at least one metal layer. Insofar, some pigments, such as described herein, can form or complement the electrically conductive pigments.

A platelet-shaped effect pigment may be used, which creates a different visually perceivable color and/or brightness impression under different lighting and/or viewing angles. In the case of different color impressions, this property is referred to as color flop. In particular those pigments that have a color flop, create in the security element or security and/or valuable products made therewith color and gloss impressions that cannot be copied and that are well visible to the naked eye without vision aids. Such pigments are also referred to as optically variable. The optically variable platelet-shaped effect pigments comprise, for example, under at least two different lighting or viewing angles, at least two and not more than four, but preferably, under two different lighting or viewing angles, two or under three different lighting or viewing angles, three optically clearly distinguishable discrete colors. Preferably, there are only the discrete colors, but no intermediate stages, that is, a clear change from one color to a different color is detectable when tilting the security element comprising the optically variable pigments. This property, on the one hand, helps the viewer to recognize the security element as such, and at the same time, makes copying of this feature difficult, since in the commercial color copiers, color flop effects cannot be copied and reproduced.

Of course, however, optically variable platelet-shaped effect pigments can also be used that, when tilting over different lighting and/or viewing angles, have a color gradient, i.e. many different shades, such as the typical pearlescent luster. Such diffuse color changes, too, are readily detectable by the human eye.

In order to exert their full optical effect, it is advantageous if the platelet-shaped effect pigments used according to the invention are present in the marking layer or the security and/or valuable product in an oriented form, i.e. they are approximately parallel to the surfaces of the security product provided with the security element. Such alignment normally is obtained by means of the usual methods for applying the security element, such as for example by conventional printing processes. It is also preferred, as already mentioned, that the electrically conductive pigments are aligned in a corresponding manner.

As platelet-shaped effect pigments, for example, the commercially available interference pigments can be used, which are sold, for example, by Mearl under the name Mearlin®, metallic effect pigments from Eckhard and goniochromatic (optically variable) effect pigments such as Vario-Chrom® from BASF, Chromafflair® from Flex Products Inc., Helicone® from Wacker, or holographic pigments from Spectratec, and other similar commercially available pigments. This list, however, should only be regarded as illustrative rather than exhaustive.

As inorganic color pigments, all common, transparent and opaque, white, colored and black pigments, such as Prussian blue, bismuth vanadate, goethite, magnetite, hematite, chromium oxide, chromium hydroxide, cobalt aluminate, ultramarine, chromium-iron mixed oxides, spinels such as cobalt blue, cadmium sulfides and selenides, chromate pigments or carbon black are suitable, whereas as organic pigments, in particular quinacridones, benzimidazoles, copper phthalocyanine, azo pigments, perinones, anthanthrones, other phthalocyanines, anthraquinones, indigo, thioindigo and their derivatives, or carmine can be used. Generally, all organic or inorganic color pigments are suitable, in particular those being conventional in the printing field.

To shield against ultraviolet radiation, pigments can be used, which absorb UV light. Examples are titanium dioxide and zinc oxide.

In principle, a security element according to the invention can be prepared in various ways. On the one hand, it is for example possible to produce a mixture of the polymeric material of the matrix and the other components described above and to extrude a film, wherein the extrusion is carried out in a conventional manner in accordance with the polymeric material used. The film thus obtained can then optionally be separated into individual film pieces and laminated or glued into or onto a security and/or valuable document.

Alternatively, a printable composition according to the invention, in particular a printing ink, can be produced. It will contain the organic polymeric material of the matrix, the at least one luminescent substance, which is capable of non-contact excitation of light emission in the presence of the conductive pigment, the at least one electrically conductive pigment, and optionally at least one aqueous and/or organic solvent (preferred are organic solvents), the luminescent substance not being encapsulated. In addition, the composition may contain at least one charge carrier transport material, as well as the other components described above, such as color pigments, effect pigments, optically variable pigments, UV blockers, preservatives, rheology-modifying agents, and stabilizers. Suitable organic solvents are the solvents described above in connection with the polymeric material of the matrix and its preparation, and all conventional solvents and solvent mixtures being conventional in the printing technology, in particular the ink jet printing technology. However, the use of aqueous dispersions, which contain less than 10 wt-% organic solvents, is also possible. Then the matrix with its further components according to the invention consists of dispersed film-forming particles. The composition may, depending on the intended application, be a solution, dispersion, emulsion, or paste.

As printing techniques, all techniques being conventional in the field of security and/or valuable documents can be used, such as screen printing, flexo printing, offset printing, letterpress printing, gravure printing, intaglio printing, thermosublimation, or inkjet printing. Alternatively, of course, spreading, use of squeegees or rollers, stamping, casting, such as film casting, painting, dipping, rolling or grid application processes, spin coating, calendering, etc. are also possible. As a substrate for the application of the security element, all substrates available in the field of security and/or valuable documents can be used, such as plastic films based on polymers, as already mentioned above in connection with the polymeric material of the matrix. However, substrates made of paper, cardboard, textile materials, etc. are also possible. Finally, any objects, such as branded products, may serve as substrates. In the latter case, these items are then marked by the application of the security element according to the invention and are thus authenticatable and distinguishable from counterfeit products.

A security element according to the invention (if applicable, after drying) comprises, for example: A) 0.1 to 5 wt-%, particularly 1 to 5 wt-% luminescent substance, B) 60 to 95 wt-%, in particular 85 to 95 wt-% matrix, C) 2 to 15 wt-%, particularly 5 to 10 wt-%, electrically conductive pigment, D) 0 to 37.9 wt-%, particularly 0.1 to 9 wt-% additives, and/or pigments different from C), the relative amounts of the components A) to D) always totaling 100%.

The invention further relates to a security and/or valuable document, comprising a substrate layer, optionally one or a plurality of additional layers, as well as at least one printing layer or film according to the invention, the printing layer or film being applied over the entire surface or over part of the surface of the substrate layer or an additional layer. The printing layer or film may be incorporated in so far in the layer structure of a security and/or valuable document or be stacked thereon. Such a document can be produced by that the substrate layer and/or the additional layer is formed from an organic polymeric material (e.g., as a film), wherein on the substrate layer or the additional layer, a printing layer or a film according to the invention is applied, and wherein, if applicable, the substrate layer and additional layer, optionally with a cover layer, are laminated together, before or after the application of the printing layer or film. Such a security and/or valuable document is verifiable or authenticatable by exposing the security and/or valuable document to physical conditions, which stimulate the luminescent substance to emit light, wherein the light emission is observed or measured, and wherein the security and/or valuable document, in accordance with the observation or measurement, is classified as genuine or forged. Such conditions include, for example, that the document is introduced in a gap electrode, which is supplied with an alternating electric field being dimensioned for the excitation of light emission.

All above detailed explanations in connection with the security element can be applied accordingly to the other above-mentioned aspects of the invention.

By means of the invention, a number of advantages and possibilities can be achieved. A machine-readable security element with the greatest variety of usable electroluminescences, preferably in the UV, visible light and IR ranges is provided. Emitter materials having different emission characteristics (color/wavelengths) at different excitations can be used, for example in the visible range, UV, or electrical excitation. By appropriate mixtures of the emitter materials, practically any emission colors/wavelengths can be obtained. Furthermore, effects being time-resolved and accordingly detectable and thus evaluable by measurement are achieved by that different lifetimes of excited states and the corresponding selection of the emitter materials are provided. Therefore, different levels of security for a security element can be obtained, starting with the visible color information of the emission, up to (forensic) information, such as the shape of the emission spectrum, decay behavior, and phase shifts of the emission. By appropriate selection of the emitter materials, so to speak a fingerprint of the matrix can be provided, which is characterized by a unique intensity profile of the emission spectrum. Because of the used (organic) emitter materials, a chemically qualitative and/or quantitative analysis of the security element for counterfeiting purposes is made considerably more difficult. Finally, "starry sky"-like patterns, such as described in the documents DE 10304805 A1 and WO 2010/006583, i.e. random patterns, can be generated. The local luminescence then also depends, for example, on the random lateral distribution of the electrically conductive particles, which may be statistically uniform, while in the micro range (5 to 100 times the lateral dimension of the electrically conductive particles) they may be laterally dispersed in an uneven manner. These patterns can be also used to generate random patterns, such as they are necessary for the generation of cryptographic keys, or can serve as the basis for material-based PUFs (physical unclonable functions).

Furthermore, these random patterns allow an electro-optical personalization and machine-detectable information/identification as a "serial number", such as described in the document WO 2010/006583.

In the following the invention is explained in more detail with reference to non-limiting embodiments.

Example 1: Preparation of Usable Polycarbonate Derivatives

Example 1.1: Preparation of a First Polycarbonate Derivative 183.3 g (0.80 mol) of bisphenol A (2,2-bis-(4-hydroxyphenyl) propane, 61.1 g (0.20 mol) of 1,1-bis-(4-hydroxyphenyl)-3,3,5-trimethyl cyclohexane, 336.6 g (6 moles of KOH and 2,700 g of water were dissolved in an inert atmosphere with stirring). Then a solution of 1.88 g of phenol in 2,500 ml of methylene chloride was added. Into the well-stirred solution, 198 g (2 mol) phosgene were introduced at pH 13 to 14 and 21 to 25° C. Then 1 ml of ethyl piperidine was added and stirred for another 45 min. The bisphenolate-free aqueous phase was separated, and the organic phase was washed, after acidification with phosphoric acid, with water until neutral and freed from solvent.

The polycarbonate derivative exhibited a relative solution viscosity of 1.255.

Example 1.2 Preparation of a Second Polycarbonate Derivative

Analogously to Example 1.1, a mixture of 127.1 g (0.56 mol) of bisphenol A and 137.7 g (0.44 mol) of 1,1-bis-(4-hydroxyphenyl)-3,3,5-trimethylcyclohexane was reacted to polycarbonate.

The polycarbonate derivative exhibited a relative solution viscosity of 1.263.

Example 1.3 Preparation of a Third Polycarbonate Derivative

As in Example 1, a mixture of 149.0 g (0.65 mol) of bisphenol A and 107.9 g (0.35 mol) of 1,1-bis-(4-hydroxyphenyl)-3,3,5-trimethylcyclohexane was reacted to polycarbonate.

The polycarbonate derivative exhibited a relative solution viscosity of 1.263.

Example 2.1: Preparation of a First Liquid Composition Used According to the Invention As a liquid composition to be applied by printing, for example by screen printing, the following solution was prepared: 17.5 parts by weight of the polycarbonate of Example 1.3, 82.5 parts by weight of the following solvent mixture, consisting of:

| | |
|---|---|
| Mesitylene | 2.4 |
| 1-methoxy-2-propanolacetate | 34.95 |
| 1,2,4-trimethylbenzene | 10.75 |
| Ethyl-3-ethoxypropionate | 33.35 |
| Cumene | 0.105 |
| Solvent naphtha | 18.45 |

There was obtained a colorless, highly viscous solution with a solution viscosity of 800 m Pas at 20° C.

To 90 wt-% of this solution, 8 wt-% of a commercially available solution of a polyfluorene in toluene (1.5 wt-% polyfluorene in toluene) were added as a component capable of emitting light. Finally, 2 wt-% of an electrically conductive pigment, for example of a mica pigment as described in the general part, were added. The mixture was homogenized and was thus ready to use.

Alternatively to the solution of the matrix polymer, a corresponding amount of the commercially available solution APEC PUD 6581-9 (Merck) can also be used.

Example 2.2: Preparation of a Second Liquid Composition Used According to the Invention The preparation was made analogous to Example 2.1, except that instead of the polyfluorene solution, the same amount of the following solution was used.

In toluene, a solution of a mixture of 5 wt-% iridium (III) tris-(2-(4-totyl) pyridinato-N,C2) (electroluminescence material), 10 wt-% N,N'-bis-(3-methylphenyl)-N,N'-bis-(phenyl) benzidine (hole transporting material, TPD), 25 wt-% 2-(4-biphenyl)-5-(4-tert-butylphenyl)-1,2,4-oxadiazole (electron transport material, TBPO), and 60 wt-% polystyrene was prepared. The total amount of said four compounds is 2.5 wt-% finished solution.

Example 3: Preparation of a Security Element According to the Invention

A polycarbonate film Makrofol® 6-2 (thickness approx. 100 µm) was imprinted, for example, with the preparation of Example 2.1 or 2.2 using digital printing, such as ink printing. Alternatively, screen printing may be used.

After drying, the printed film contains 0.5 wt-% luminescent substance, 90 wt-% organic polymeric material of the matrix, 8 wt-% conductive pigments.

The imprinted polycarbonate film thus obtained can be then laminated with other polycarbonate films, and that directly, i.e. without the use of interposed adhesive layers. The individual film layers practically form a continuous piece of polycarbonate, as the materials laminated together, including the printed structures, are all based on polycarbonate. The layers can no longer be detached from one another, thus an extremely high protection against forgery being achieved, since access to the printed structures is practically impossible.

Example 4: Different Emission Wavelengths of a Security Element According to the Invention A security and/or valuable document prepared according to the invention may contain within the printing layer (identical or different) luminescent substances, which at different excitation modes emit at different wavelengths or show a center wavelength. In any case, an emission takes place with non-contact electrical stimulation.

In FIG. 1, spectra of an embodiment according to the invention are shown. The spectrum shown by the solid line is the light component reflected in the visible range (or not absorbed) and reproduces the color impression of the security element without any other excitation. The short-dashed spectrum represents the emission of the security element for non-contact electrical excitation. The long-dashed spectrum shows the emission when excited with UV. As can be seen, a different color, depending on the type of excitation, is detected by the viewer (or an automatic test device). Depending on the type of excitation, a shift or change in the shape of the spectrally dispersed emission takes place.

What is claimed is:

1. A security element for a security and/or valuable document, comprising a matrix based on an organic polymeric material, wherein at least one electrically conductive pigment is dispersed in the matrix, and at least one organic light-emitting semiconductor dispersed in the matrix, which semiconductor is capable of non-contact excitation of light emission, in the presence of the conductive pigment, and wherein the particle size of the conductive pigment is less than 200 nm, and the organic light-emitting semiconductor is not encapsulated, and is directly surrounded by the matrix and is embedded therein, wherein properties of the security element depend on an interaction of the organic polymeric material and the at least one organic light-emitting semiconductor in the matrix that differs depending on a type of excitation.

2. The security element according to claim 1, wherein the organic polymeric material is selected from the group consisting of PC (polycarbonate, particular bisphenol A polycarbonate), PET (poly-ethylene glycol terephthalate), PMMA (polymethyl methacrylate), TPU (thermoplastic polyurethane elastomers), PE (polyethylene), PP (polypropylene), PI (polyimide or poly-trans-isoprene), PVC (polyvinyl chloride), polystyrene, polyacrylates and methacrylates, vinyl acetate, ABS and copolymers of such polymers, preferably is a polycarbonate derivative, in particular based on bisphenol A, preferably based on a geminally disubstituted dihydroxybiphenyl cycloalkane.

3. The security element according to claim 1, wherein the organic light-emitting semiconductor is an OLED material, wherein the organic light-emitting semiconductor is homogeneously dispersed, in particular dissolved in the matrix.

4. The security element according to claim 1, wherein the electrically conductive pigment is platelet-shaped, in particular with an aspect ratio of at least 2:1, and a mean particle diameter from 1 to 500 µm, and preferably is transparent, or a nanorod or a nanotube.

5. The security element according to claim 1, further comprising at least one charge carrier transport material.

6. The security element according to claim 1, additionally comprising one or a plurality of substances or materials selected from the group consisting of color pigments, effect pigments, optically variable pigments, UV blockers, preservatives, and stabilizers.

7. The security element according to claim 1, wherein the security element includes:
   A) 0.1 to 5 wt-% organic light-emitting semiconductor,
   B) 60 to 95 wt-% matrix,
   C) 2 to 15 wt-% electrically conductive pigment,
   D) 0 to 37.9 wt-% additives and/or pigments different from C),
   the relative amounts of the components A) to D) always totaling 100%.

8. A printable composition, in particular a printing ink, for the production of a security element according to claim 1, comprising an organic polymeric material, at least one electrically conductive pigment, at least one organic light-emitting semiconductor, which is capable, in the presence of the electrically conductive pigment, of non-contact excitation of light emission, and at least one aqueous and/or organic solvent, wherein the organic light-emitting semiconductor is not encapsulated and has a particle size less than 200 nm.

9. A preparation according to claim 8, further comprising at least one charge carrier transport material.

10. The preparation according claim 8, additionally comprising one or a plurality of substances or materials selected from the group consisting of color pigments, effect pigments, optically variable pigments, UV blockers, preservatives, rheology-modifying agents, and stabilizers.

11. A security and/or valuable document, comprising a substrate layer, optionally one or a plurality of additional layers, and at least one printing layer or film according to claim 8, wherein the printing layer or film is applied over the entire surface or over part of the surface of the substrate layer or an additional layer.

12. A method for producing the security and/or valuable document of claim 11, wherein the substrate layer and/or the additional layer is formed from a paper material or an organic polymeric material, wherein on the substrate layer or the additional layer, a printing layer or film is applied, containing 0.1 to 5 wt-% organic light-emitting semiconductor, 60 to 90 wt-% matrix, 2 to 15 wt-% electrically conductive pigment, 0 to 37.9 wt-% additives and/or pigments different from the conductive pigment, and wherein said substrate layer and the additional layer are laminated together, before or after the application of the printing layer or film.

13. A method of verification of a security and/or valuable document of claim 11, comprising the steps of: exposing the security and/or valuable document to physical conditions, which, in the presence of the electrically conductive particles, stimulate the organic light-emitting semiconductor to emit light, observing and measuring the light emission, and classifying the security and/or valuable document, in accordance with the observation or measurement, as genuine or forged.

* * * * *